United States Patent [19]

Morihiro et al.

[11] Patent Number: 4,805,217
[45] Date of Patent: Feb. 14, 1989

[54] RECEIVING SET WITH PLAYBACK FUNCTION

[75] Inventors: Yoshiharu Morihiro; Minoru Nishida, both of Hyogo, Japan

[73] Assignee: Mitsubishi Denki Kabushiki Kaisha, Tokyo, Japan

[21] Appl. No.: 779,831

[22] Filed: Sep. 25, 1985

[30] Foreign Application Priority Data

Sep. 26, 1984 [JP] Japan .............................. 59-202801
Mar. 5, 1985 [JP] Japan ................................ 60-43316

[51] Int. Cl.$^4$ .............................................. G10L 3/02
[52] U.S. Cl. ....................................... 381/35; 381/34; 369/7
[58] Field of Search .................................. 381/29–39, 381/51; 369/7; 360/33.1

[56] References Cited

U.S. PATENT DOCUMENTS

| | | | |
|---|---|---|---|
| 3,325,596 | 6/1967 | Manley | 381/33 |
| 3,538,265 | 11/1970 | Keeler | 369/7 |
| 3,786,195 | 1/1974 | Schiffman | 381/34 X |
| 4,280,192 | 7/1981 | Moll | 381/35 X |
| 4,376,874 | 3/1983 | Karban et al. | 381/34 |
| 4,408,309 | 10/1983 | Kiesling et al. | 369/7 |

FOREIGN PATENT DOCUMENTS 53-55906   5/1978   Japan .
54-63604   5/1979   Japan .
55-102931  8/1980   Japan .
61-39772   9/1986   Japan .

OTHER PUBLICATIONS

VSC Company, "Low Cost Module for Speech Compression, Pitch Correction, Frequency Shifting", 1978.

Primary Examiner—Patrick R. Salce
Assistant Examiner—Marc S. Hoff
Attorney, Agent, or Firm—Bernard, Rothwell & Brown

[57] ABSTRACT

A receiving set is capable of recording the sound of the broadcast received, while enabling the listener to listen to the present broadcast, and of reproducing the recorded sound when requested by the listener. A digital memory device is provided for recording the detected audio signal in compressed form on the time axis. The memory device is accessed upon request by the listener and the signal read out of the memory is processed to produce a sound.

8 Claims, 4 Drawing Sheets

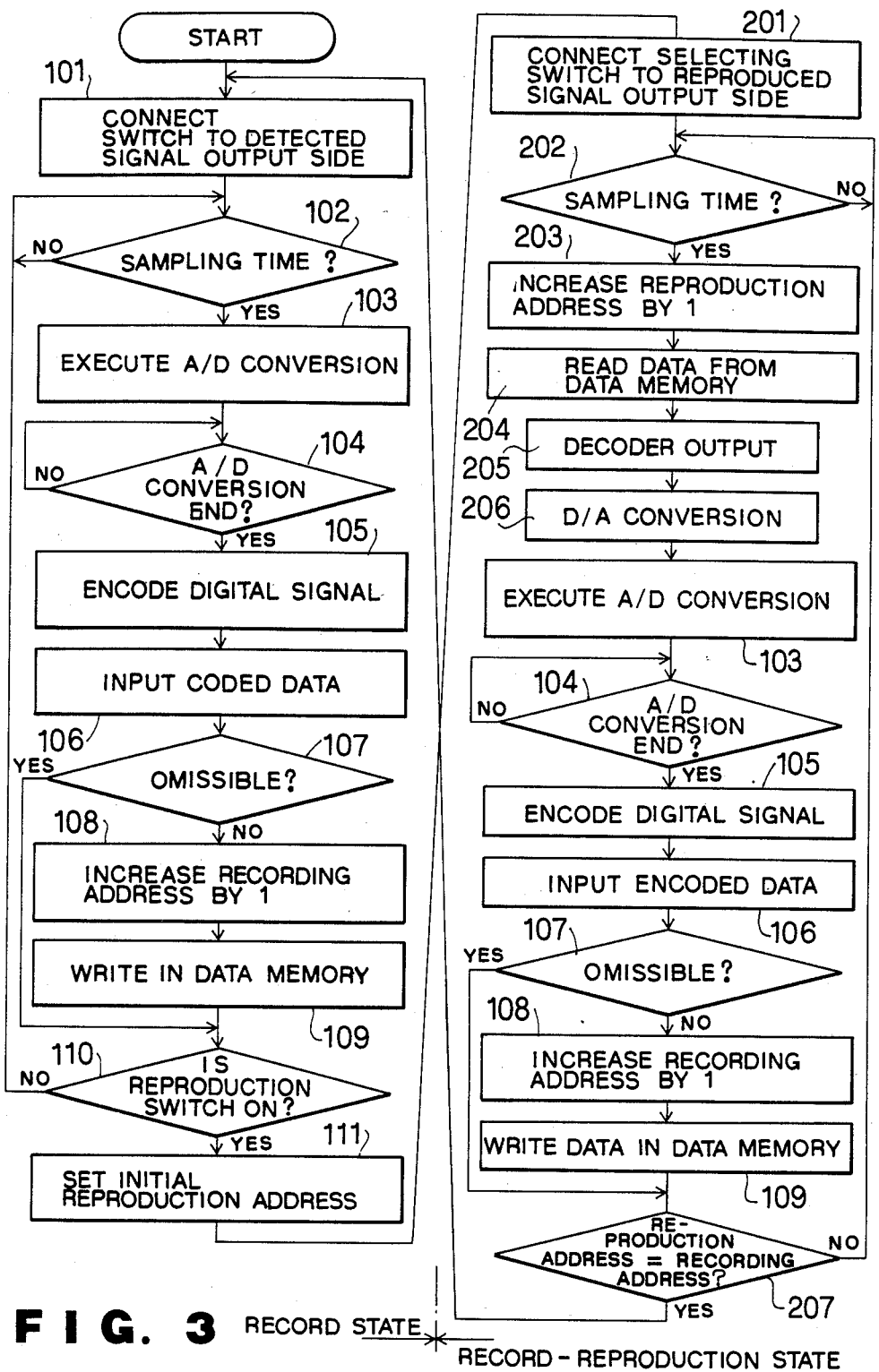
FIG. 3    RECORD STATE | RECORD-REPRODUCTION STATE

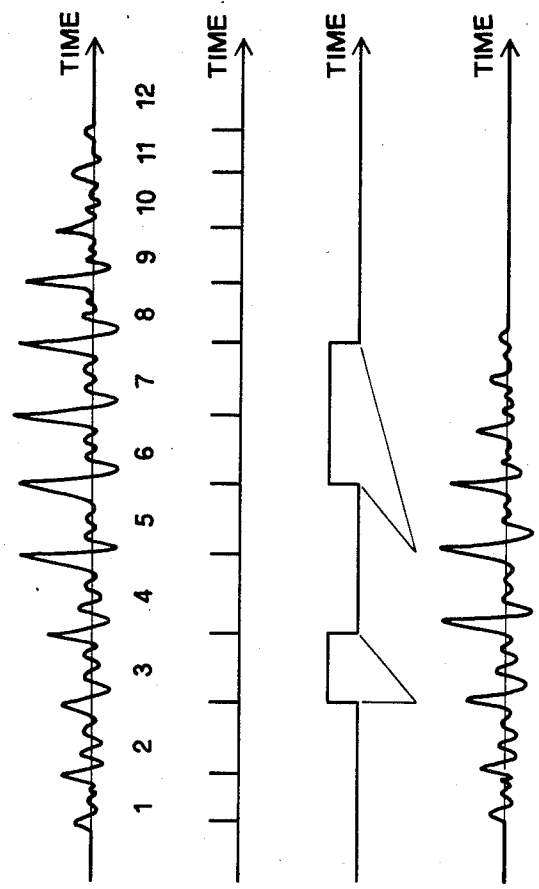

RECEIVING SET WITH PLAYBACK FUNCTION

BACKGROUND OF THE INVENTION

1. Field of the Invention

The present invention relates to a receiving set capable of recording the received sound of a radio set or the like and reproducing the recorded sound at an optional time.

2. Description of the Prior Art

Sometimes the listener fails inadvertently to hear important information in listening to the news on the radio. Particularly the listener often fails to hear information in listening in to the information on the radio while the listener is driving an automobile or the like.

Recording the received information on an endless recording tape is a simple method to solve such problem. However, this method is capable of reproducing the portion of the broadcast which could not be heard, whereas the same is incapable of enabling the listener to listen in to the present broadcast.

The present invention has been made in view of the above-mentioned circumstances. Accordingly, it is an object of the present invention to provide a receiving set capable of repeating the radio broadcast or the like which the listener failed to hear and capable of storing the radio broadcast during the reproduction of the previous radio broadcast.

A receiving set according to the present invention comprises: a record circuit to convert a received and detected audio signal into a signal suitable for recording; signal compressing means to compress the output signal of the record circuit on a time axis; a memory to store the output signal of the signal compressing means; a reproducing circuit to reproduce the contents of the memory; a switch for selectively providing the received and detected audio signal or the output audio signal of the reproducing circuit; reproduction request detecting means to detect whether or not a reproduction request is given; state switching control means to establish a reception-record state in which the switch is controlled so as to provide the received and detected signal, when the reproduction request is not given, and to establish a reception-record-reproduction state in which the switch is controlled so as to provide the output audio signal of the reproducing circuit and the received and detected sound signal is compressed and stored in the memory during the reproducing operation, when the reproduction request is given; and state reset control means to reset the state switching control means in the reception-record state upon the coincidence of the received and detected audio signal and the output audio signal of the reproducing circuit in the reception-record-reproduction state.

According to the present invention, the reproduction request detecting means detects whether or not the reproduction request is given, the state switching control means establishes the reception-record state in which the switch, the record circuit and the signal compressing means are controlled so as to provide the received and detected audio signal as an output signal of the receiving set and to compress and store the received and detected signal in the memory when the reproduction request is not given, and establishes the reception-record-reproduction state in which the reproducing circuit and the switch are controlled so as to reproduce the contents of the memory, to provide the reproduced signal as the output signal of the receiving set and to compress the received and detected audio signal and store the compressed sound signal in the memory during reproducing operation, and the state reset control means resets the receiving set in the record-reproduction state upon the coincidence of the received and detected audio signal and the output audio signal of the reproducing circuit in the reception-record-reproduction state.

BRIEF DESCRIPTION OF THE DRAWINGS

FIG. 3 is a flow chart showing the operating procedure of the receiving set of FIG. 1; and FIGS. 4(a), 4(b), 4(c), and 4(d) are waveform diagrams for assistance in explaining the manner of omitting repetitive waveforms.

DESCRIPTION OF THE PREFERRED EMBODIMENT

Figure 1:
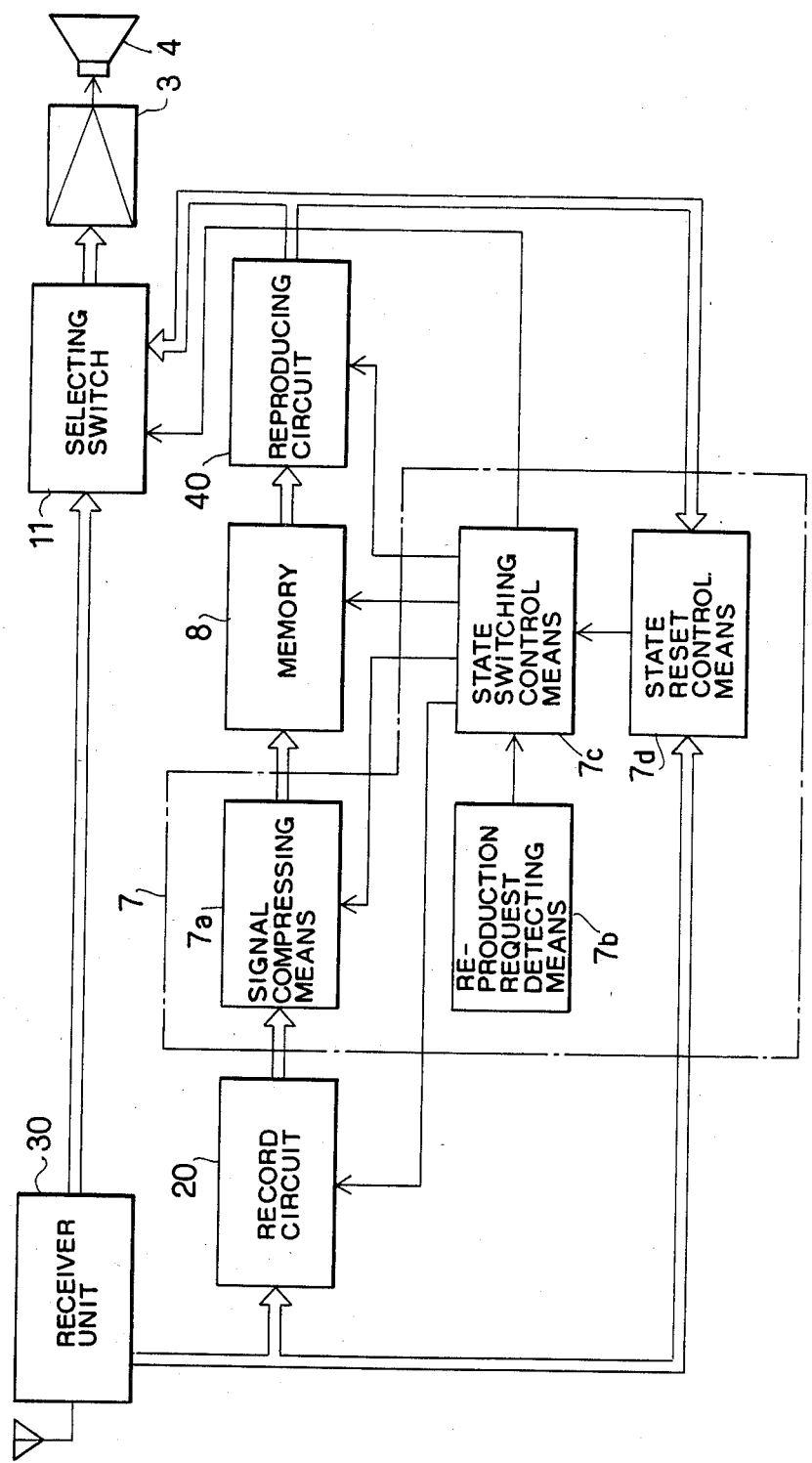
FIG. 1 is a block diagram of a receiving set, in a preferred embodiment, according to the present invention, showing the general constitution thereof.

FIG. 1 shows the general constitution of a receiving set embodying the present invention. As apparent from FIG. 1, in this embodiment, the receiving set includes a receiving unit 30, a record circuit 20 which converts a sound signal provided by the receiving unit 30 into a signal suitable for recording, a memory 8 for storing the signal suitable for recording, a reproducing circuit 40 which reproduces the contents of the memory 8 and provides an audio signal, and a selecting switch 11 which selects one of the output signal of the receiving set between the output audio signal of the receiving unit 30 and the output audio signal of the reproducing circuit. Reproduction request detecting means 7b detects whether or not a reproduction request is given. State switching control means 7c establishes a reception-record state in which the switch 11, the record circuit 20 and signal compressing means 7a are controlled so that the output audio signal of the receiving unit 30 is provided as an output signal of the receiving set and the output audio signal of the receiving unit 30 is compressed and stored in the memory 8 when the reproduction request is not given, and establishes a reception-record-reproduction state in which the reproducing circuit 40 and the switch 11 are controlled so that the contents of the memory 8 are reproduced and the output audio signal of the receiving unit 30 is compressed and recorded in the memory 8 when the reproduction request is issued. The state reset control means 7d resets the receiving unit automatically in the reception-recording state upon the coincidence of the output sound signal of the receiving unit 30 and the output signal of the reproducing circuit 40.

Figure 2:
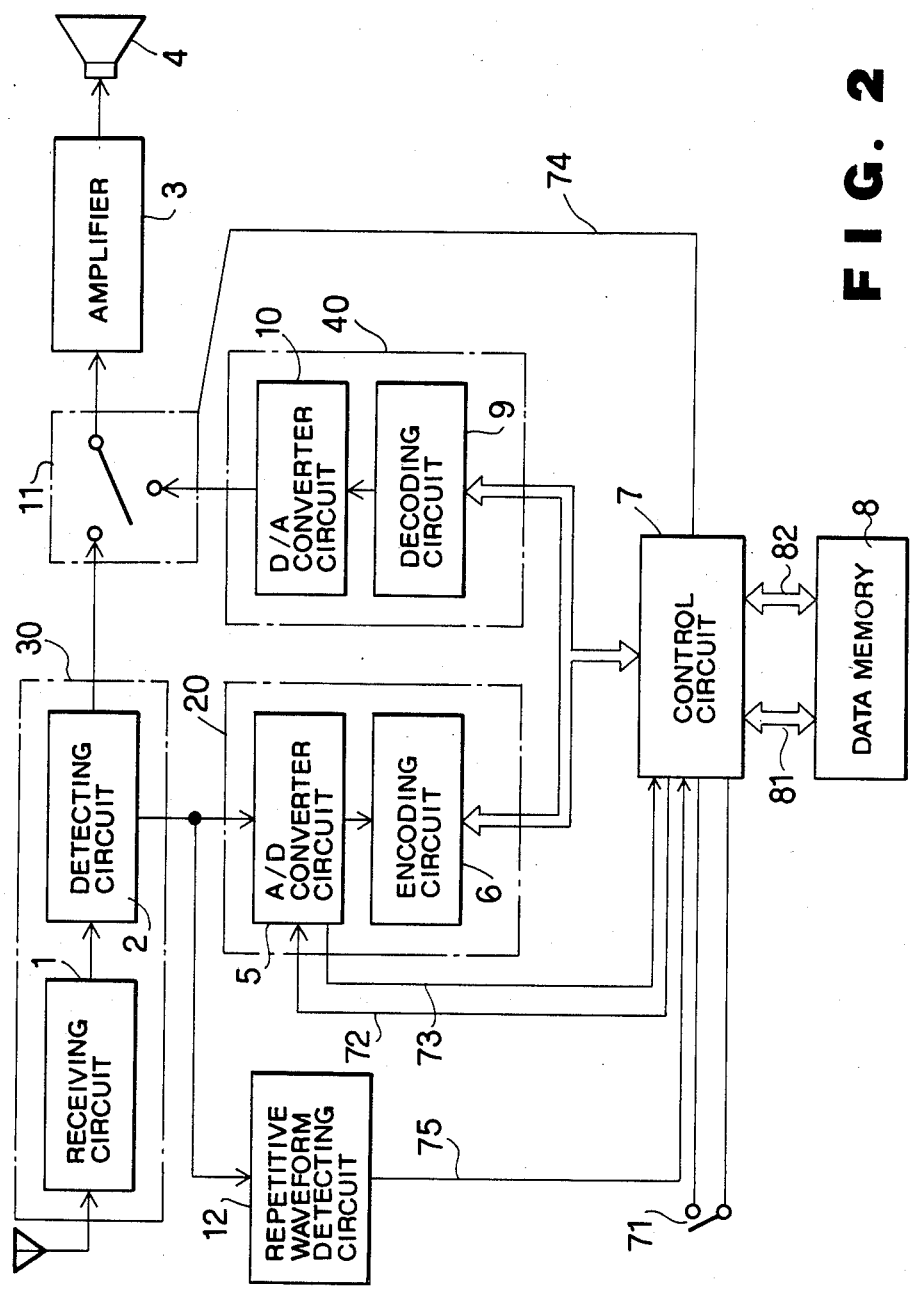
FIG. 2 is a block diagram showing a concrete constitution of the receiving set of FIG. 1.

FIG. 2 shows the constitution of the receiving set of FIG. 1 more concretely in a block diagram. In FIG. 2, indicated at 1 is a receiving circuit 1 for receiving radio waves and indicated at 2 is a detecting circuit for detecting received radio waves. The receiving circuit 1 and the detecting circuit 2 constitute the receiving unit 30 of FIG. 1. An amplifier circuit 3 amplifies the audio signal detected by the detecting circuit 2. Indicated at 4 is a well-known speaker for a radio set.

An A/D converter circuit 5, a sample hold circuit and a low-pass filter for anti-aliasing converts the sound signal detected by the detecting circuit 2 into a digital signal suitable for recording. Suppose that the audio signal is sampled at a sampling frequency of 8 KHz and is converted into an 8-bit pulse code through digital conversion, the audio signal is converted into a digital signal having an information content of 64 kilo bits/sec. In this case, the pass band of the low-pass filter needs to be 4 KHz or below.

An encoding circuit 6 receives a digital signal from the A/D converter circuit 5 and encodes the digital signal to compress the information content thereof. In coding the digital signal, a coding method is selected from the ADPCM method (adaptive differential pulse-code modulation method), the DM method (delta modulation method) and the PARCOR method (partial autocorrelation method) taking into consideration the relation between the amount of the audio signal and memory capacity. Of these methods, the ADPCM method and the PARCOR method are capable of compressing a sound signal of 64 kilo bits/sec. information content to 16 to 32 kilo bits/sec. and to 2 to 10 kilo bits/sec., respectively. The A/D converter circuit 5 and the encoding circuit 6 constitute the record circuit 20 which converts the output audio signal of the receiving unit 30 into a signal suitable for recording. An IC chip: MSM5218RS (Oki Electric Industry Co., Ltd.), for instance, may be used for the record circuit 20.

Indicated at 7 is a control circuit comprising a microcomputer and a programmable memory for actuating the microcomputer. The control circuit 7 receives coded digital data from the encoding circuit 6 and stores the coded digital signal in a data memory 8. The control circuit 7 also reads the digital data stored in the data memory 8 and gives the digital data to a decoding circuit 9. An IC chip: MC6801 (Motorola Corp.) may be employed for the control circuit 7.

The data memory 8 is a RAM (random access memory). The data memory 8 is connected to the control circuit 7 by an address bus 81 and a data bus 82. The Dynamic RAM: M5K4164 (MITSUBISHI DENKI KABUSHIKI KAISHA) may be employed for the data memory 8.

The decoding circuit 9 receives the output digital data of the control circuit 7 and expands the information content to convert the digital data into a digital signal. This decoding process is entirely reverse to the coding process performed in the encoding circuit 6.

A D/A converter circuit 10 comprises a D/A converter, a data latch and a smoothing low-pass filter. The D/A converter circuit 10 converts a digital signal given thereto by the decoding circuit 9 into an analog audio signal. The reproduced audio signal is applied through the switch 11 to the amplifying circuit 3. The decoding circuit 9 and the D/A converter circuit 10 constitute the reproducing circuit 40 to produce an audio signal by reproducing the contents of the data memory 8. An IC: MSM5218RS (Oki Electric Industry Co., Ltd.) may be employed for the reproducing circuit 40.

The selecting switch 11 is controlled by a signal supplied through a control line 74 by the control circuit 7 so as to transmit to the speaker 4 either a detected radio waves the detecting circuit 2 or a reproduced audio signal provided by the D/A converter circuit 10.

A repetitive waveform detecting circuit 12 decides whether or not the detected audio signal includes any repetitive waveform. If the detected audio signal includes a repetitive waveform, the repetitive waveform detecting circuit 12 decides whether or not the one cycle of the waveform is similar to that of the preceding waveform. Since waveform repetition occurs frequently, particularly in the low-frequency components of the audio signal, the frequency band of the audio signal is limited to 1 KHz or below before the A/D conversion of the audio signal, then a predetermined number of data is accumulated in a data register, and then autocorrelation coefficients are obtained by using the accumulated data. When the maximal value thereof exceeds a fixed threshold, the repetitive waveform detecting circuit 12 gives a detection signal 75 indicating to the control circuit 7 that the waveform is a repetitive waveform.

When a reproduction switch 71 connected to the control circuit 7 is depressed, the control circuit 7 starts controlling the circuits so that the recorded broadcast is reproduced.

The control circuit 7 gives an A/D conversion command signal 72 to the A/D conversion circuit 5. Upon the reception of the A/D conversion command signal 72, the A/D converter circuit 5 samples and holds the present analog signal, and then starts the A/D conversion operation. Upon the completion of the A/D conversion, the A/D converter circuit 5 gives an A/D conversion end signal 73 to the control circuit 7 to report the completion of the A/D conversion to the control circuit 7.

The reproduction request detecting means 7b of FIG. 1 is the combination of the reproduction switch 71 and the control circuit 7 of FIG. 2. The state reset control means 7d of FIG. 1 resets the receiving set in the record state upon the detection of the coincidence of the output audio signal of the receiving unit 30 and the output audio signal of the reproducing circuit 40 in the record-reproduction state. Practically, the state reset control means 7d changes the state upon the detection of the coincidence of the recording address and the reproducing address in the memory 8.

The manner of operation of the receiving set will be described hereinafter with reference to the flow chart shown in FIG. 3.

When the power source is switched on, the state switching control routine including Steps 101 to 110 is executed to set the receiving set in the reception-record state (referred to as "recording state" hereinafter). When the power source is switched on, the selecting switch 11 selects the output terminal of the detecting circuit (Step 101), so that the radio broadcast is given by a speaker 4 and, at the same time, the contents of the radio broadcast are converted into digital data and the digital data is compressed and stored in the memory. Recording is performed once in one sampling period (for example, in 125 ⅜sec when the sampling frequency is 8 KHz) to store one digital data in one sampling period. Thus, the process is implemented in synchronism with the sampling time (Step 102).

At the first stage of the operation in the recording state, the control circuit 7 gives an A/D conversion command 72 to the A/D conversion circuit 5 (Step 103). Upon the reception of the A/D conversion command, the A/D converter circuit 5 samples and holds the analog audio signal at the moment of reception of the command, and converts the analog signal into a digital signal thereafter. This conversion needs to be completed within the one sampling time.

Upon the completion of the A/D conversion, the A/D converter circuit 5 gives an A/D conversion end signal 73 to the control circuit 7. Upon the detection of the A/D conversion end signal 73, the control circuit 7 starts the next operation (Step 104). The digital signal provided by the A/D converter circuit 5 is coded by the encoding circuit 6 (Step 105), and then the coded digital signal is given to the control circuit 7 (Step 106).

Then, a signal compressing operation including Steps 107 to 109 is executed.

The control circuit 7 monitors the detection signal 75 of the repetitive waveform detecting circuit 12 and decides if this sound waveform can be omitted (Step 107).

When the audio waveform is omissible, the data of the audio waveform is not stored and is truncated. If not, the control circuit 7 increases the recording address one by one (Step 108) and gives the address to the address bus 81. Thus the output signal of the encoding circuit 6 is given through the data bus 82 to the data memory 8 (Step 109). The recording in the memory 8 starts from an address 0 (zero) and the capacity of the memory is limited, therefore, after the memory of all the addresses have been filled up, the recording starts from the address 0 again. For example, when the bit length of the recording address code is 16, the number of the last address is 65535 and the address 0 is used after the address 65535 is assigned.

Repetitive waveforms often appear in the continuous portion of vowel sounds and the tenuto of music.

The period of the repetitive waveform of the vowel sound of an audio signal is designated as "pitch", which is 5 to 10 msec for male voice and 2.5 to 5 msec for female voice.

The repetitive waveform omitting operation will be explained in connection with FIGS. 4(a) to 4(d). FIG. 4(a) shows an exemplary waveform of the vowel portion of a voice signal. Pitch signals of the voice waveform is detected as shown in FIG. 4(b) to divide the voice waveform of FIG. 4(a) into twelve pitches.

If the similarity of those successive waveforms is examined at every period and one of the successive waveforms is omitted when the successive waveforms are similar to each other, the waveforms corresponding to the third, sixth and seventh pitches are omitted as shown in FIG. 4(c) showing omissible signals. A recording waveform shown in FIG. 4(d) is obtained by omitting the omissible waveforms according to omission signals. The recording waveform corresponds to a reproducing waveform. Excessive omission of repetitive waveforms makes the reproduction of the original sound impossible, therefore, the omission of repetitive waveforms is limited to an extent within which the original sound can be reproduced.

The signal compressing operation including Steps 107 to 109 has been explained with reference to an example employing the repetitive waveform detecting circuit 12, however, the signal compressing operation may be carried out in the following manner. The control circuit 7 examines the coded data and decides if the data represents silence (Step 107). When the voice level is below a threshold, the voice is decided to be silent and this data is omitted. On the other hand, if the voice is decided to be a sound, the control circuit 7 gives the recording address to the address bus 81 so that the output signal of the encoding circuit 6 is given through the data bus 82 and stored in the data memory 8 (Step 109).

In a voice signal, silence occurs not only between sentences, but also at the interruption of voice and at assimilated sounds. Therefore, the reproduced voice will sound unnatural if the data corresponding to the interruption of voice and assimilated sounds is omitted through the compressing operation. Accordingly, a short silent period should not be regarded as silent and needs to be recorded. Therefore, silent periods longer than 30 milliseconds are regarded as silent periods and these silent periods are omitted.

In the above-mentioned recording state, a series of operations is carried out within one sampling period. During the recording state, a reproduction request detecting operation is executed at Step 110 to detect whether or not the reproduction switch 71 is closed. The recording state is maintained as long as the reproduction switch 71 is not closed.

When the reproduction switch is closed, a state switching control operation including Steps 111, 201 to 206, 103 to 109 and 207 is executed to set an initial reproduction address (Step 111) so that the state of the receiving set is changed to reception-record-reproduction state (referred to as "record-reproduction state" hereinafter).

The initial reproduction address in the record-reproduction state varies with the time of precedence of the initial data to be reproduced. When the precedent broadcast is reproduced by using the full data memory, the initial reproduction address is equivalent to the recording address or greater than the recording address by one. For example, when the data memory has 256 kilobits and the information content after coding is 32 kilobits/sec., the broadcast preceding by eight seconds can be reproduced.

When the information content after coding is 32 kilobits, the data bus 82 of the data memory 8 is an 8-bit bus and the broadcast preceding by one second is required to be reproduced, the initial reproduction address of the memory 8 is precedent to the recording address by 4000 addresses.

The manner of operation in the record-reproduction state will be described hereinafter.

When the record-reproduction state is established, first the selecting switch 11 is connected to select the reproduced signal output (Step 201). Then, in synchronism with the sampling time (Step 202), the control circuit 7 increases the reproduction address by one (Step 203), and then sends the address information through the address bus 81 to the data memory 8 to read the data corresponding to that address through the data bus 82 (Step 204). The read digital data is sent to the decoding circuit 9, where the digital data is decoded and converted into the original digital signal (Step 205). The digital signal is converted into a reproduced audio signal by the D/A converter circuit 10 (Step 206) and the reproduced audio signal is provided through the switch 11 and the amplifying circuit 3 by the speaker 4. Thereafter, the present broadcast is compressed and recorded during the reproduction of the contents of the data memory. This procedure is entirely the same as that in the record state, and hence the explanation thereof will be omitted.

When the past recorded data is reproduced while the present broadcast is recorded, the speaker always produces the reproduction of the recorded past broadcast. Since the sound signals are compressed and recorded by omitting repetitive sound signals, the reproduction address increases one by one, notwithstanding the recording address does not increase in the record-state in which some waveforms are omitted. Consequently, the reproduction address approaches the recording address gradually and, finally, the reproduction address coincides with the recording address, in a waveform omission state (Step 207). Upon the coincidence of the reproduction address and the recording address, the record-reproduction state is terminated and the selecting switch 11 is switched to select the detected audio signal so that the record state is established (Step 101) and the original operation is executed. Thus the state reset control operation including Steps 207 and 101 is carried out.

In the record-reproduction state, the reproduction of the past broadcast is started upon the operation of the reproduction switch 71 and, simultaneously, the present broadcast is recorded during the reproducing operation and the amount of recorded content is decreased gradually. Accordingly, the receiving set is switched automatically to the original broadcast receiving state without interrupting the broadcast. Accordingly, the listener is able to listen to the past broadcast to which he has failed to listen, without any unnatural feeling. Furthermore, the radio broadcast can continuously be provided. Since the repetitive portions are omitted during recording, the receiving set is reset in the original receiving state, the portions of broadcast to which the listener failed to listen to are reproduced by operating the reproduction switch.

In this embodiment, the signal is compressed on a time axis by detecting and omitting repetitive waveforms or by omitting silent portions in recording. It is also possible to compress the signal by making the sampling period for reproduction shorter than that for recording, namely, by making the frequency of reading data from the memory greater than the frequency of A/D conversion command given by the control circuit to the A/D converter circuit so that the digital signal reproducing speed is higher than the recording speed.

This embodiment employs one reproduction switch 71, however, a plurality of reproduction switches may be provided to enable the selection of the time for reproducing the past broadcast. It is also possible to provide the receiving set with an indicator to indicate the record state or the record-reproduction state.

This embodiment is provided with the encoding circuit 6 and the decoding circuit 9 to compress the information content so that the information content stored in the data memory 8 is increased, however, when the information content to be stored in the data memory is small, those circuits may be omitted.

This embodiment is constituted so as to store sound signals in digital signals, however, audio signals may be stored in analog signals sampled at every sampling time by using a BBD element or a CCD element.

In this embodiment, the repetitive waveform is detected by hardware, namely, the repetitive waveform detecting circuit, however, the repetitive waveform can also be detected by software by the control program of the control circuit. In the latter case, the A/D conversion circuit and the memory of the receiving unit are used for A/D conversion and data accumulation.

Although the present invention has been described hereinbefore as applied to a radio set, the present invention is applicable to other radio receiving sets for the same effects as those described herein.

As apparent from the foregoing description, the receiving set according to the present invention compresses and records the received signals while the radio broadcast is received, and reproduces the recorded contents when a reproduction request is given, while the compression and recording of the received signals is continued during the reproducing operation. Accordingly, the information to which the listener failed to listen initially can be listened to later.

What is claimed is:

1. A receiving set comprising: a record circuit to convert a received and detected audio signal into a signal suitable for recording; signal compressing means to compress the output signal of the record circuit on a time axis; a memory to store the output signal of the signal compressing means; a reproducing circuit to reproduce the contents of the memory; a switch for selectively providing the received and detected audio signal or the output audio signal of the reproducing circuit; reproduction request detecting means to detect whether or not a reproduction request is given; state switching control means to establish a reception-record state in which the switch is controlled so as to provide the received and detected signal, when the reproduction request is not given, and to establish a reception-record-reproduction state in which the switch is controlled so as to provide the output audio signal of the reproducing circuit and the received and detected audio signal is compressed and stored in the memory during reproducing operation, when the reproduction request is given; and state reset control means to reset the state switching control means in the reception-record state upon the coincidence of the received and detected audio signal and the output audio signal of the reproducing circuit in the reception-record-reproduction state.

2. A receiving set according to claim 1, wherein the state switching control means reproduces the contents of the memory from a predetermined address which has previously stored information, upon the reception of the reproduction request.

3. A receiving set according to claim 2, wherein the state reset control means is adapted to decide the coincidence of the received and detected audio signal and the output audio signal of the reproducing circuit through the detection of the coincidence of the audio recording address and the reproduction address in the reception-record-reproduction state.

4. A receiving set according to claim 3, wherein said record circuit includes an A/D conversion circuit for converting the audio signal into a digital signal and an encoding circuit for coding the output digital signal of the A/D conversion circuit, and said reproducing circuit includes a decoding circuit for decoding the coded digital data stored in the memory to reproduce the original digital signal and a D/A conversion circuit to convert the digital signal into the corresponding sound signal.

5. A receiving set according to claim 4, wherein said signal compressing means compresses a signal by detecting repetitive waveforms included in the output signal of the record circuit and eliminating the detected repetitive waveforms.

6. A receiving set according to claim 4, wherein said signal compressing means compresses a signal by detecting silent portions of the output signal of the record circuit and eliminating the detected silent portions.

7. A receiving set according to claim 4, wherein said signal compressing means compresses a signal by reproducing the digital signal at a reproducing speed higher than the recording speed.

8. A receiving set comprising: a record circuit to convert a received and detected audio signal into a digital signal; signal compressing means to compress the output signal of the record circuit on a time axis; a memory to store the output signal of the signal compressing means; a reproducing circuit to convert a digital signal reproduced from the memory into an audio signal; a switch to provide selectively the received and detected audio signal or the output audio signal of the reproducing circuit; reproduction request detecting means to detect whether or not a reproduction request is given; state switching control means to make the switch provide the received and detected audio signal and to make the memory store the received and detected signal given through the signal compressing means, when the reproduction request is not given, and to make the switch provide the audio signals reproduced sequentially by the reproducing circuit from the contents of the memory stored at predetermined addresses and to make the memory store the received and detected audio signal giventhereto through the signal compressing means, when the reproduction request is given; and state reset control means to change the output of the switch from the output audio signal of the reproducing signal to the received and detected audio signal upon the detection of the coincidence of the recording address for storing the received and detected audio signal in the memory and the reproduction address for reproducing the audio signal of the reproducing circuit from the memory, while the output signal of the switch is the output audio signal of the reproducing circuit.

* * * * *

UNITED STATES PATENT AND TRADEMARK OFFICE
CERTIFICATE OF CORRECTION

PATENT NO. : 4,805,217

DATED : February 14, 1989

INVENTOR(S) : Yoshiharu Morihiro et al.

It is certified that error appears in the above-identified patent and that said Letters Patent is hereby corrected as shown below:

Column 3, line 60, delete the word "a";

line 61, after "waves" insert the word --from--.

Signed and Sealed this

Fifth Day of December, 1989

Attest:

JEFFREY M. SAMUELS

Attesting Officer    Acting Commissioner of Patents and Trademarks